United States Patent
Wang et al.

(10) Patent No.: US 10,217,720 B2
(45) Date of Patent: Feb. 26, 2019

(54) MULTI-CHIP MODULES FORMED USING WAFER-LEVEL PROCESSING OF A RECONSTITUTE WAFER

(71) Applicant: Invensas Corporation, San Jose, CA (US)

(72) Inventors: Liang Wang, Milpitas, CA (US); Rajesh Katkar, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/624,494

(22) Filed: Jun. 15, 2017

(65) Prior Publication Data

US 2018/0366436 A1   Dec. 20, 2018

(51) Int. Cl.
| | | |
|---|---|---|
| H01L 25/10 | (2006.01) |
| H01L 25/065 | (2006.01) |
| H01L 23/31 | (2006.01) |
| H01L 25/00 | (2006.01) |
| H01L 21/56 | (2006.01) |
| H01L 21/768 | (2006.01) |
| H01L 23/00 | (2006.01) |

(52) U.S. Cl.
CPC ........ *H01L 25/0652* (2013.01); *H01L 21/566* (2013.01); *H01L 21/76877* (2013.01); *H01L 23/3114* (2013.01); *H01L 23/3135* (2013.01); *H01L 24/05* (2013.01); *H01L 24/19* (2013.01); *H01L 24/24* (2013.01); *H01L 24/82* (2013.01); *H01L 25/50* (2013.01); *H01L 2224/24145* (2013.01); *H01L 2224/821* (2013.01); *H01L 2225/06527* (2013.01); *H01L 2225/06548* (2013.01); *H01L 2225/06562* (2013.01); *H01L 2225/06586* (2013.01); *H01L 2924/14* (2013.01)

(58) Field of Classification Search
CPC ... H01L 25/0652; H01L 25/50; H01L 21/566; H01L 21/76877; H01L 24/82; H01L 24/24; H01L 24/05; H01L 24/19; H01L 23/3114; H01L 23/3135
See application file for complete search history.

(56) References Cited

U.S. PATENT DOCUMENTS

| | | |
|---|---|---|
| 8,227,904 B2 | 7/2012 | Braunisch et al. |
| 8,872,349 B2 | 10/2014 | Chiu |
| 8,901,748 B2 | 12/2014 | Manusharow et al. |
| 8,912,670 B2 | 12/2014 | Teh et al. |
| 9,216,236 B2 | 9/2015 | Roos et al. |

(Continued)

*Primary Examiner* — Ahmed N Sefer

(57) ABSTRACT

Apparatuses and methods are described. This apparatus includes a bridge die having first contacts on a die surface being in a molding layer of a reconstituted wafer. The reconstituted wafer has a wafer surface including a layer surface of the molding layer and the die surface. A redistribution layer on the wafer surface includes electrically conductive and dielectric layers to provide conductive routing and conductors. The conductors extend away from the die surface and are respectively coupled to the first contacts at bottom ends thereof. At least second and third IC dies respectively having second contacts on corresponding die surfaces thereof are interconnected to the bridge die and the redistribution layer. A first portion of the second contacts are interconnected to top ends of the conductors opposite the bottom ends thereof in part for alignment of the at least second and third IC dies to the bridge die.

9 Claims, 10 Drawing Sheets

(56) References Cited

U.S. PATENT DOCUMENTS

| | | |
|---|---|---|
| 9,153,552 B2 | 10/2015 | Teh et al. |
| 9,159,690 B2 | 10/2015 | Chiu |
| 9,171,816 B2 | 10/2015 | Teh et al. |
| 9,190,380 B2 | 11/2015 | Teh et al. |
| 9,269,701 B2 | 2/2016 | Starkston et al. |
| 9,275,971 B2 | 3/2016 | Chiu et al. |
| 9,349,703 B2 | 5/2016 | Chiu et al. |
| 9,627,365 B1* | 4/2017 | Yu ................. H01L 23/5227 |
| 9,666,559 B2 | 5/2017 | Wang et al. |
| 2012/0199960 A1 | 8/2012 | Cosue et al. |
| 2013/0265733 A1 | 10/2013 | Herbsommer et al. |
| 2014/0103488 A1* | 4/2014 | Chen ................. H01L 23/5389 257/532 |
| 2016/0035666 A1* | 2/2016 | Huang ................ H01L 21/565 257/666 |
| 2016/0343685 A1* | 11/2016 | Lin ................... H01L 21/561 |
| 2017/0179078 A1* | 6/2017 | Jung .................... H01L 25/50 |
| 2017/0345761 A1* | 11/2017 | Yu .................. H01L 23/5389 |
| 2018/0005984 A1* | 1/2018 | Yu ................. H01L 23/49838 |
| 2018/0012863 A1* | 1/2018 | Yu .................. H01L 25/0652 |
| 2018/0026008 A1* | 1/2018 | Jeng .................... H01L 25/18 |
| 2018/0053746 A1* | 2/2018 | Yu ..................... H01L 25/50 |

* cited by examiner

MULTI-CHIP MODULES FORMED USING WAFER-LEVEL PROCESSING OF A RECONSTITUTE WAFER

FIELD

The following description relates to microelectronic devices. More particularly, the following description relates to multi-chip modules formed using wafer-level processing of a reconstituted wafer.

BACKGROUND

Conventionally forming multi-chip modules has been costly and/or difficult. Accordingly, it would be desirable and useful to provide a multi-chip module formed with less cost and/or less difficulty than in the past.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 2-1 and 2-2 are schematic diagrams of top-down views each depicting an exemplary portion of an in-process reconstituted wafer respectively with and without a usable gap between adjacent upper integrated circuit dies bridged by a lower integrated circuit die.

FIG. 3 is a schematic diagram of a top-down view depicting an exemplary portion of an in-process reconstituted wafer with through-mold vias.

FIGS. 4-1 through 4-6 (collectively "FIG. 4") is a schematic diagram of a progression of cross-sectional side views depicting an exemplary portion of an in-process reconstituted wafer used to provide multi-chip modules ("MCMs") with a mezzanine redistribution layer between adjacent upper integrated circuit dies and a lower integrated circuit die.

FIG. 5 is a schematic diagram depicting an exemplary conductive stack in a portion of a mezzanine redistribution layer of an MCM of FIG. 4.

FIG. 6 is a block diagram of a top-down view depicting an exemplary MCM of FIG. 1 or FIG. 4 having four integrated circuit dies bridged by a same bridge die.

DETAILED DESCRIPTION

Figure 1:
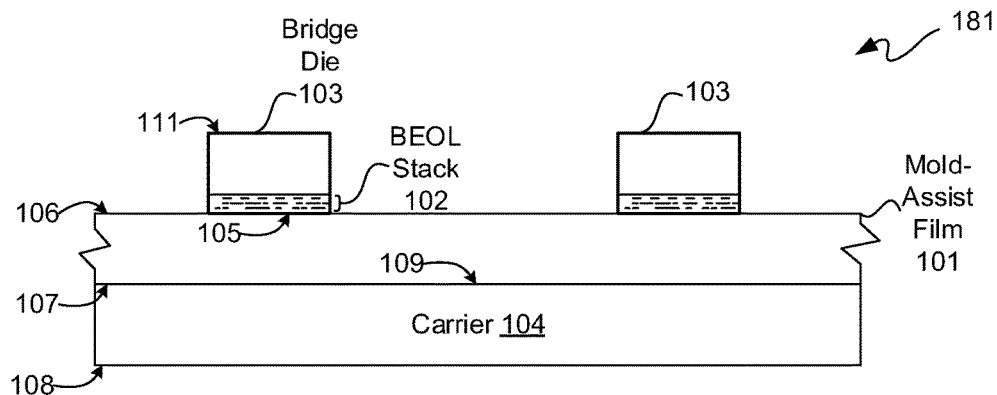
FIGS. 1-1 through 1-14 (collectively "FIG. 1") is a schematic diagram of a progression of cross-sectional side views depicting an exemplary portion of an in-process reconstituted wafer used to provide multi-chip modules ("MCMs")

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

A method relates generally to forming a microelectronic device. In such a method, a first integrated circuit die having first contacts on a die surface thereof is molded in a molding layer to form a reconstituted wafer. The reconstituted wafer has a wafer surface including a layer surface of the molding layer and the die surface of the first integrated circuit die. Conductors are formed extending away from the first contacts. The conductors are directly coupled to the first contacts at bottom ends of the conductors. Second contacts respectively of at least second and third integrated circuit dies are coupled to top ends of the conductors opposite the bottom ends thereof. The second contacts on die surfaces of the at least second and third integrated circuit dies overlap the first contacts on the die surface of the first integrated circuit die. The at least second and third integrated circuit dies are respectively coupled to the top ends of the conductors in part for aligning of the at least second and third integrated circuit dies to the first integrated circuit die.

Another method relates generally to forming a microelectronic device. In such a method, a first integrated circuit die having first contacts on a die surface thereof is molded in a molding layer to form a reconstituted wafer. The reconstituted wafer has a wafer surface including a layer surface of the molding layer and the die surface of the first integrated circuit die. A redistribution layer is formed on the wafer surface of the reconstituted wafer. The redistribution layer includes electrically conductive layers and dielectric layers to provide conductive routing and conductors. The conductors extend away from the die surface of the first integrated circuit die and are respectively coupled to the first contacts at bottom ends of the conductors. At least second and third integrated circuit dies respectively having second contacts on die surfaces thereof are obtained. A first portion of the second contacts are interconnected to top ends of the conductors opposite the bottom ends thereof in part for aligning of the at least second and third integrated circuit dies to the first integrated circuit die. A second portion of the second contacts are interconnected to the conductive routing.

An apparatus relates generally to a microelectronic device. In such an apparatus, a first integrated circuit die having first contacts on a die surface thereof is in a molding layer of a reconstituted wafer. The reconstituted wafer has a wafer surface including a layer surface of the molding layer and the die surface of the first integrated circuit die. A redistribution layer is on the wafer surface. The redistribution layer includes electrically conductive layers and dielectric layers to provide conductive routing and conductors. The conductors extend away from the die surface of the first integrated circuit die and are respectively coupled to the first contacts at bottom ends of the conductors. At least second and third integrated circuit dies respectively having second contacts on die surfaces thereof are interconnected to the first integrated circuit die and the redistribution layer. A first portion of the second contacts are interconnected to top ends of the conductors opposite the bottom ends thereof in part for alignment of the at least second and third integrated circuit dies to the first integrated circuit die. A second portion of the second contacts are interconnected to one another through the conductive routing.

Other features will be recognized from consideration of the remainder of the Detailed Description and the Claims, which follow.

FIGS. 1-1 through 1-14 is a schematic diagram of a progression of cross-sectional side views depicting an exemplary portion of an in-process reconstituted wafer 100. Reconstituted wafer 100 may be for providing microelectronic devices, including without limitation multi-chip modules ("MCMs"). With simultaneous reference to FIGS. 1-1 through 1-14, formation of a reconstituted wafer 100 is further described.

A mold assist film 101 may be placed on an upper surface of a carrier 104. Carrier 104 may be a separate platform or a mold form. Mold assist film 101 may be a tape or other form of mold assist film. Use of terms such as "upper" and "lower" or other directional terms is made with respect to the reference frame of the figures and is not meant to be limiting with respect to potential alternative orientations, such as in further assemblies or as used in various systems.

A lower surface 107 of mold assist film 101 may be placed on an upper surface 109 of carrier 104 or other form of support platform. Along those lines, lower surface 107 may be indexed to upper surface 109 covering an area. A lower surface 108 of carrier 104 may be for positioning in an injection or other molding machine. Thus, surfaces 107 and 109 may generally be coplanar to one another.

Upper surface 109 of carrier 104 may be at least substantially flat in accordance with having an upper surface 106 of mold assist film 101 being substantially flat. However, lower surfaces 105 of bridge dies 103, which may be at least substantially coplanar with one another, may be depressed into upper surface 106 of mold assist film 101. Lower surfaces 105 of bridge dies 103 are placed on upper surface 106 of mold assist film 101. Bridge dies 103, which may include active or passive integrated circuit ("IC") dies or a combination thereof, may be positioned spaced apart from one another on an upper surface 106 of mold assist film 101.

An upper surface 111 of bridge die 103 may generally be associated with what is referred to as a "front side" of an IC die. Along those lines, a front-side of an in-process IC semiconductor wafer may be used for forming what is referred to as front-end-of-line ("FEOL") structures of IC dies. Generally, FEOL structures may include shallow trench isolations ("STI"), transistor gates, transistor source/drain regions, transistor gate dielectrics, a contact etch stop layer ("CESL"), a pre-metallization dielectric or pre-metal dielectric ("PMD"), and contact plugs, among other FEOL structures.

A lower surface 105 of bridge die 103 may generally be associated with what is referred to as a "backside" of an IC die. Along those lines, a backside of an in-process IC semiconductor wafer may be used for forming what is referred to as back-end-of-line ("BEOL") structures. Generally, BEOL structures may include one or more inter-level dielectrics ("ILDs") and one or more levels of metallization ("M"). Each ILD may be composed of one or more dielectric layers. Additionally, metal from a metallization level may extend through one or more ILDs, as is known. Furthermore, each level of metallization may be composed of one or more metal layers. A passivation level may be formed on a last metallization layer. Such passivation level may include one or more dielectric layers, and further may include an anti-reflective coating ("ARC").

For bridge die 103 a passive die, there may not be any FEOL structures, and thus such a passive bridge die 103 may include only BEOL structures. Along those lines, for purposes of clarity by way of example and not limitation, it shall be assumed that bridge die 103 is a passive die, even though in other examples bridge die 103 may be an active die.

A BEOL stack 102 of bridge die 103 may be in contact with an upper surface 106 of mold assist film 101 along a lower surface 105 of such BEOL stack 102, which is likewise a lower surface 105 of bridge die 103. Accordingly, it should be understood that bridge die 103 has be diced or singulated from an IC semiconductor wafer. Accordingly, for the following description, reference to wafer-level processing ("WLP") refers to processing of or at a reconstituted wafer 100, as described below in additional detail. Moreover, even though two instances of a bridge die 103 are illustratively depicted, a reconstituted wafer 100 may have many more than two instances of a bridge die 103.

Thus, generally at operation 181, bridge dies 103 are placed backside down on an upper surface 106 of a mold-assist film 101, where mold-assist film 101 has previously been adhered to an upper surface 109 of a carrier 104. Die surfaces 105 of corresponding bridge dies 103 may be adhered to an upper surface 106 of a mold release film 101.

At operation 182, a molding layer 114 may be deposited, injected or otherwise formed over upper surfaces 111 and along sidewall surfaces 113 of bridge dies 103. Molding one or more bridge dies in a molding layer 114 may be used to form a reconstituted wafer 100 for subsequent WLP. Forming molding layer 114 over and between bridge dies 103 and onto surface 106 of mold release film 101 is for providing a reconstituted wafer 100, as such molding layer 114 and bridge dies 103 combination provides at least a portion of a reconstituted wafer 100.

At operation 183, carrier 104 and mold assist film 101 may be removed from reconstituted wafer 100, and reconstituted wafer 100 may be flipped or otherwise inverted to have upper surfaces 105 and lower surfaces 111 of bridge dies. Bridge dies 103 may include fine-pitch contacts 116. Examples of fine pitch contacts include micro pads, micro bumps and the like. Conventionally, fine pitch contacts 116 are formed as BEOL structures during formation of bridge dies 103, which may be formed on a same IC semiconductor wafer. Fine pitch contacts 116 may be formed as a last metal deposition of a BEOL stack, so fine pitch contacts 116 may be on upper surfaces 105 of bridge dies 103.

By fine pitch, it is generally meant having or capable of having pitches of less than approximately 60 microns. By approximately, it is generally meant within 10 percent of the ascribed value. Such fine pitches may require less than approximately a two-micron line space for conductors 121. For purposes of clarity by way of example and not limitation, it shall be assumed that fine pitch contacts 116 refers to microbumps.

Upper surfaces 105 may protrude slightly higher than upper surface 115 after molding. In other words, an upper layer surface 115 of molding layer 114 is at a lower level with respect to upper die surfaces 105 of bridge dies 105. Along those lines, upper surfaces 105 may appear as islands encircled by molding material of molding layer 114.

In another implementation, fine pitch contacts 116 may be Direct Bond Interconnect ("DBI") contacts, where such DBI contacts 116 may include DBI pads and DBI posts. DBI contacts may have a pitch in a range of approximately 1 to 100 microns. Along those lines, prior to forming DBI contacts 116, an upper surface 115 of molding layer 114 and upper surfaces 105 of bridge dies 103 may be polished, lapped, ground, or otherwise surfaced by a surfacing operation 117, to have upper surfaces 105 and 115 at least sufficiently coplanar for WLP for DBI. For this surfacing operation 117, optionally another carrier (not shown) may be used for supporting reconstituted wafer 100. In this example, DBI contacts 116 may be formed after surfacing operation 117.

At operation 184, a resist or other pattern forming layer 119 may be deposited, spun or otherwise formed on an upper surface 118 of reconstituted wafer 100, namely on upper surfaces 105 and upper surface 115. For purposes of clarity, upper surfaces 105 and upper surface 115 in combination are referred singly as a wafer surface 118 of reconstituted wafer 100. In other words, reconstituted wafer 100 has a wafer surface 118 which includes a layer surface 115 of molding layer 114 and at least one die surface 105 of at least one bridge die 103.

At operation 185, resist layer 119 is patterned to etch resist-through holes from an upper surface 122 of resist layer 119 down to contacts 116 of bridge dies 103 along upper surfaces 105. However, in another example, patterning of resist layer 119 may be avoided by using a direct write operation, such as laser drilling for example. After forming resist-through holes, resist-through holes may then have a conductive material deposited, plated or otherwise formed or placed in such holes to form conductors 121, such as conductive posts 121 for example, at operation 185. Though conductors 121 are depicted with solid black lines, conductors 121 may be provided with fully or partially filled holes.

Bottom ends 125 of conductors 121 may be directly coupled to contacts 116. Shafts 124 of conductors 121 may extend away from contacts 116 and thus extend away from an associated upper surface 105. Conductors 121 may be conductive posts or pillars in this example.

In this example, such conductive posts 121 may be at least substantially perpendicular to upper surface 105 to provide at least approximately a shortest conductive path for interconnection of upper dies to top ends of such conductive posts 121. Along those lines, conductive posts 121 directly coupled to fine pitch contacts 116 may be for high-speed and/or broadband signaling applications. Shafts 124 may not be exactly vertical, and thus top ends 123 and bottom ends 125 may be opposite one another, though not directly opposite one another for a shortest path implementation. For purposes of clarity by way of example and not limitation, it shall be assumed that conductive posts 121 are perpendicular to upper surface 105 such that top ends 123 of conductors 121 are directly opposite bottom ends 125 for a vertical shortest path orientation.

Resist-through holes may have therein copper, aluminum, eutectic material (e.g., solder) or other conductive material to provide conductors 121. A surfacing operation 117 may be performed on an upper surface 122 of resist layer 119 to remove excess metal and to at least locally planarize top ends 123 of conductors 121. By locally planarize, it is generally meant that top ends 123 of conductors 121 of a same bridge die 103 are substantially planar with respect to one another. This is not meant to preclude planarity of top ends 123 of conductors 121 for two or more bridge dies 103; rather, because upper IC dies 126 and 127 are indexed to top ends 123 of conductors 121 per bridge die 103, planarity between bridge dies 103 may not be needed. In other words, top ends 123 of conductors 121 collectively form an alignment feature 120 of a bridge die 103 for indexing two or more other IC dies 126 and 127 to such alignment feature 120 of such same bridge die 103.

In a DBI implementation, resist layer 119 may be a DBI pad layer, and resist-through holes may be for forming DBI posts, same as conductive posts 121, followed by other known operations for forming lower DBI contacts 121. Such lower DBI contacts 121 may collectively form an alignment feature 120 of a bridge die 103.

At operation 186, sets of fine pitch contacts 130 and 131 respectively of IC dies 126 and 127 may be directly coupled to corresponding sets of top ends 123 of an alignment feature 120 of a bridge die 103. Fine pitch contacts 130 and 131 of IC dies 126 and 127 may be formed as part of corresponding BEOL stacks 102 of such IC dies 126 and 127, and may be the same as contacts 116, such as microbumps or micro pads for example. Alignment feature 120 is in part for aligning IC dies 126 and 127 to bridge die 103 and in part for providing electrically conductive interconnects between bridge die 103 and IC dies 126 and 127.

Additionally or optionally, contacts 140 and 141 of IC dies 126 and 127 may be formed on corresponding same surfaces 129 as fine pitch contacts 130 and 131, respectively. Contacts 140 and 141 of IC dies 126 and 127 may likewise be formed as part of corresponding BEOL stacks 102 of such IC dies 126 and 127. Contacts 140 and 141 may be larger microbumps or micro pads than contacts 116 for example. Pitch of contacts 140 and 141 depends on die thickness of bridge die 103. For example, for bridge die 103 thinned down to be in a range of approximately 5 to 10 microns, through-mold via ("TMV") pitch may be as narrow as approximately 10 microns for direct writing of through-mold vias to such contacts 140 and 141. However, for a bridge die 103 having a thickness of approximately 200 microns, TMV pitch may be approximately 300 microns.

For conductive posts 121, resist layer 119 may be removed. For contacts 130 and 131 being upper DBI contacts, such DBI contacts may be formed in a known manner for interconnection with lower DBI contacts 116.

Each set of fine pitch contacts 116, 130, and 131 includes at least a 3-by-3 array. Thus, one array set of at least 3-by-3 fine pitch contacts 116 corresponds to an array set of at least 3-by-3 fine pitch contacts 130, and another array set of at least 3-by-3 fine pitch contacts 116 corresponds to an array set of at least 3-by-3 fine pitch contacts 131.

Bridge die 103 is in a face up orientation, and IC dies 126 and 127 coupled to such bridge die 103 are both in a face down orientation. In this example, a gap 128 may be between facing sidewall surfaces of IC dies 126 and 127.

Contacts 130 and 131 on corresponding lower die surfaces 129 of IC dies 126 and 127 overlap corresponding contacts 116 on an upper die surface 105 of bridge die 103. For a gap 128, top ends 123 may be available for through-mold vias for interconnection to bridge die 103, as described below in additional detail with reference to FIGS. 2-1 and 2-2.

Figures 1, 2:
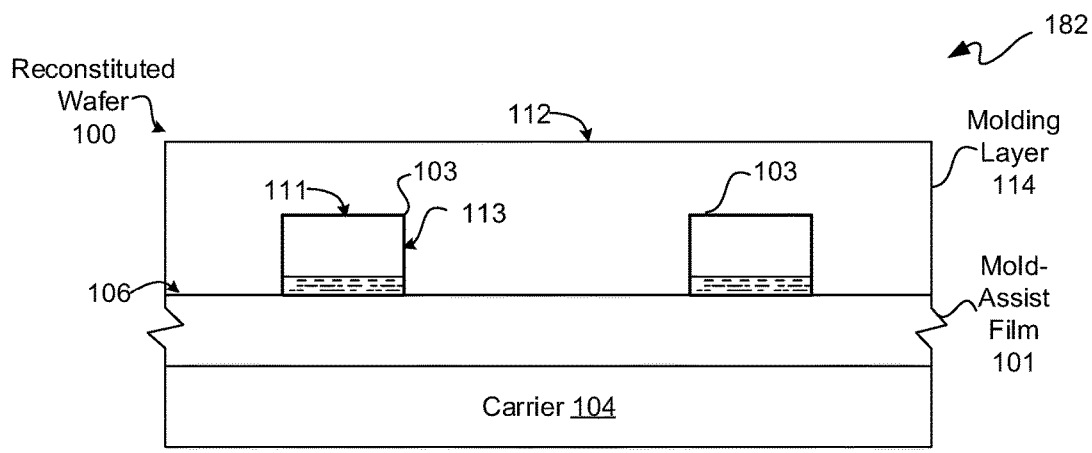

FIGS. 2-1 and 2-2 are schematic diagrams of top-down views each depicting an exemplary portion of an in-process reconstituted wafer 100. With reference to FIG. 2-1, little to no gap 128 is present between facing sidewall surfaces of upper IC dies 126 and 127. Respective portions of downwardly facing surfaces of upper IC dies 126 and 127 overlap corresponding portions of an upwardly facing surface of bridge die 103. However, FIG. 2-2 shows a usable gap 128 between facing sidewall surfaces of IC dies 126 and 127, and top ends 123 of conductive posts 121 may optionally be available for interconnection with through-mold vias, as described below in additional detail.

Returning to FIGS. 1-1 through 1-14, resist layer 119 may be removed in whole or in part, or left in place as a fill layer. Generally, resist layer 119 will be removed and not used as a fill layer. Along those lines, at operation 187, resist layer 119 may be removed, and an underfill or other fill layer 132 may be injected to be between lower die surfaces 129 of upper IC dies 126 and 127 and corresponding overlapped portions of upper surface 118 of reconstituted wafer 100. Such underfill layer 132 may be used for fine pitch contacts 116, 130 and 131 all being microbumps. For fine pitch contacts 116, 130 and 131 all being DBI contacts, material for DBI pads may effectively provide an underfill layer 132.

Though only two upper dies 126 and 127 are coupled to bridge die 103 in the example, in another implementation more than two upper dies may be coupled to a bridge die. However, at least IC dies 126 and 127 may be respectively coupled to respective sets of top ends 123 of conductors 121 in part for electrical conductivity and in part for mechanical alignment of at least such upper IC dies to such bridge die. Along those lines, such mechanical alignment may be for at least substantial coplanarity. In other words, for top ends 123 being in a plane coplanar or parallel with an upwardly facing surface 105 of a bridge die 103, downwardly facing surfaces 129 of upper IC dies 126 and 127 directly coupled to such top ends 123 may likewise be substantially coplanar with upwardly facing surface 105. In short, alignment feature 120 is for having upper IC dies aligned to a bridge die for coplanarity to provide a low-profile MCM.

At operation 188, an optional molding layer 133, namely an over mold layer 133, may be molded or otherwise formed over and between at least IC dies 126 and 127 and onto a remaining temporarily exposed portion of upper wafer surface 118 of reconstituted wafer 100. Over mold layer 133 may be used to unitize reconstituted wafer 100 with bridge die 103, an optional fill layer 132, and at least IC dies 126 and 127 for having an in-process unitized MCM 150 in such reconstituted wafer 100.

At optional operation 189, an optional surfacing operation 117 may be performed. Surfacing operation 117 may be from an upper layer surface 134 of molding layer 114 opposite layer surface 115 or 118 thereof toward die surfaces 111 of bridge dies 103 opposite die surfaces 105 thereof. Surfacing operation 117 may be used for WLP thinning of reconstituted wafer 100, as generally indicated with dashed lines. Along those lines, surfacing operation 117 may be configured to stop on die surfaces 111, or may be configured to remove portions substrates of bridge dies 103 from die surfaces 111 downward, as generally indicated with dashed lines.

Alternatively with reference to optional operation 189, an optional surfacing operation 117 may be performed at 189A. Surfacing operation 117 at operation 189A may likewise be from an upper layer surface 134 of molding layer 114 opposite layer surface 115 or 118 thereof toward die surfaces 111 of bridge dies 103 opposite die surfaces 105 thereof. Again, such surfacing operation 117 may be used for WLP thinning of reconstituted wafer 100, as generally indicated with dashed lines.

However, surfacing operation 117 of alternative optional operation 189A may be configured to stop on interior die surfaces 111 of corresponding BEOL stacks 102 of bridge dies 103, as generally indicated with dashed lines. Thus, after this thinning operation 189A, only BEOL stacks 102 may remain for bridge dies 103, such as for bridge dies 103 being passive dies. For purposes of clarity by way of example and not limitation, it shall be assumed that a surfacing operation 117 at operation 189 is used for a surfacing or thinning passed die surfaces 111 implementation to provide partially thinned substrates of bridge dies 103.

At optional operation 190, an optional surfacing operation 117 may be performed. Surfacing operation 117 may be from an upper layer surface 135 of over mold layer 133 opposite layer surface 115 or 118 thereof toward die surfaces 136 of upper active IC dies 126 and 127 opposite die surfaces 129 thereof. Surfacing operation 117 may be used for WLP thinning of reconstituted wafer 100, as generally indicated with dashed lines. Along those lines, surfacing operation 117 may be configured to stop on die surfaces 136, or may be configured to remove portions of substrates of upper active IC dies 126 and 127 from die surfaces 136 downward, as generally indicated with dashed lines. Again, for purposes of clarity by way of example and not limitation, it shall be assumed that a surfacing operation 117 at operation 190 is used for a thinning passed die surfaces 136 implementation to provide partially thinned substrates of upper active IC dies 126 and 127.

At operation 191, a compliant layer 142, such as a polyimide layer for example, may be spun, printed, deposited, or otherwise formed on layer surface 134 of molding layer 114. Further at operation 191, through-mold vias 143 extending through the compliant layer 142 and molding layer 114 to sets of contacts 140 and 141 respectively on die surfaces 129 of at least IC dies 126 and 127. Contacts 140 and 141 have a coarser or wider pitch than contacts 130 and 131. Through-mold vias 143 may be formed by a direct-write laser drilling operation followed by plating with a conductive material or other process for forming through-mold vias.

Through-mold vias 143 may generally consist of a metallic or other conductive material generally filling a void in an opening formed in a molding layer to provide through-mold vias 143. In various examples, a through-mold via 143 may generally consist of copper or a copper alloy. However, a through-mold via 143 may additionally or alternatively include one or more other conductive materials such as tantalum, nickel, titanium, molybdenum, tungsten, aluminum, gold, or silver, including various alloys or compounds of one or more of the these materials, and the like. A through-mold via 143 may include non-metallic additives to control various environmental or operational parameters of a through-mold via 143.

Optionally, holes for through-mold vias 143 may be formed followed by deposition of a conductive material matrix, such as for example a solder paste, in such holes to form through-mold vias 143. Optionally, hole for through-mold vias 143 may be formed followed by respectively wire bonding, such as ball bonding, wire bond wires to contacts 140 and 141 to provide bond via arrays for through-mold vias 143. However, for purposes of clarity by way of example and not limitation, it shall be assumed that through-mold vias 143 are formed by plating laser drilled via holes.

Figures 1, 2, 3:
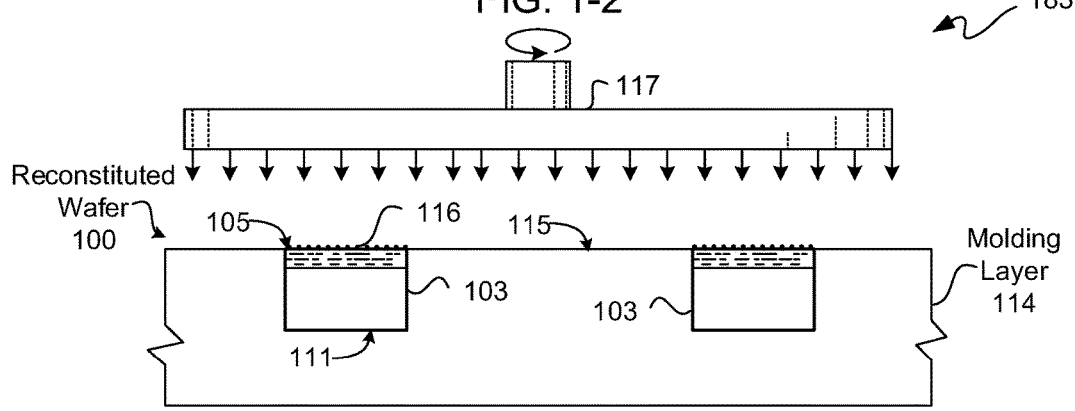
Figures 1, 2, 3, 4:
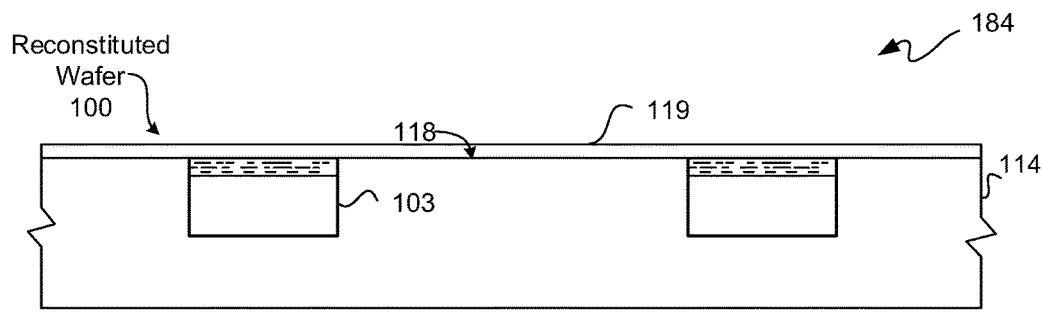

With additional reference to FIG. 3, where there is shown a schematic diagram of a top-down view depicting an exemplary portion of an in-process reconstituted wafer 100, operation at 191 is further described. Optionally at operation 191, reconstituted wafer 100 may be flipped over to form through-mold vias 144 similar to through-mold vias 143. Along those lines, for a usable gap 128 between facing sidewall surfaces of IC dies 126 and 127, top ends of through-mold vias 144 may optionally be available for interconnection to contacts 116. Optionally through-mold vias 144 may be formed through molding layer 133 from upper layer surface 135 down to contacts 116 of bridge die 103 in a gap 128 between IC dies 126 and 127. However, for purposes of clarity by way of example and not limitation, it shall be assumed that through-mold vias 144 are not formed.

With continued reference to FIGS. 1-1 through 1-14, at operation 192, an interconnect structure 145 may be formed or attached. For example, a Redistribution Layer or RDL 145 may be formed for interconnect structure 145. However, in another implementation, a package substrate 145 may be attached as an interconnect structure 145. For purposes of clarity and not limitation, it shall be assumed that an RDL 145 is used.

Such RDL 145 may be formed on an upper surface 146 of compliant layer 142. RDL 145 may include at least one substantially electrically conductive layer 147, such as a metal layer 147 for example, and at least one substantially non-electrically conductive layer 148, such as a dielectric layer 148. However, generally RDL 145 includes more than one metal layer 147 and more than one dielectric layer 148.

A metal layer of metal layers 147 of RDL 145 may be coupled for electrical conductivity to through-mold vias 143. Such one or more metal layers 147 may include contact pads upon which solder balls 149 may be formed for electrical conductivity to through-mold vias 143. Solder balls 149 and thus contact pads therefor may consume more area than upper ends of through-mold vias 143, and so RDL 145 may be used to provide an electrical fan-in interface to contacts 140 and 141 respectively of IC dies 126 and 127. One or more dielectric layers 148 may be formed with a laminate process, and conductive routing may be bumped with solder balls 149 for subsequent attachment to a printed circuit board ("PCB") or a package substrate or other larger scale platform as compared with MCMs 150 of reconstituted wafer 100.

Conventionally, an RDL may include: a dielectric layer, such as a polyimide layer for example; a metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

At operation 193, MCMs 150 may be singulated from a reconstituted wafer 100. Such MCMs may provide a stand-alone "2.5D" module formed using WLP. In an example, bridge die 103 is a passive bridge die having minimum pitch routing for interconnecting at least IC dies 126 and 127 to one another for high-speed and/or high bandwidth communication between such IC dies. Though a passive bridge die 103 was described above, bridge die 103 need not be a passive die. In an implementation, bridge die 103 may be a memory die, and IC dies 126 and 127 may share memory of bridge die, where bridge die 103 includes an arbiter for such sharing of memory.

FIGS. 4-1 through 4-6 is a schematic diagram of a progression of cross-sectional side views depicting an exemplary portion of an in-process reconstituted wafer 200. Reconstituted wafer 200 may be for providing microelectronic devices, including without limitation MCMs. Operations 181 and 182 described with reference to FIGS. 1-1 and 1-2, respectively, as well as other above description are the same for both reconstituted wafers 100 and 200, and so such description is generally not repeated for purposes of clarity with respect to reconstituted wafer 200 of FIGS. 4-1 through 4-6. With simultaneous reference to FIGS. 1-1 through 1-12 and 4-1 through 4-6, formation of a reconstituted wafer 200 is further described.

At operation 281, an RDL 201 may be formed on die surfaces 105 and molding layer surface 115 respectively of bridge dies 103 and molding layer 114 for forming at least a portion of a reconstituted wafer 200. In contrast to operation 183, an optional surfacing operation 117 may be avoided at operation 281, as for example a polyimide dielectric of RDL 201 may effectively fill differences between surfaces 105 and 115 of wafer surface 118 of reconstituted wafer 200, which is generally indicated as a lower surface 218 of RDL 201.

Such RDL 201 may be formed on an upper wafer surface 118 and may include at least one mainly electrically conductive layer, such as for example a metal layer 202, and at least one substantially non-electrically conductive layer 203, such as for example a dielectric layer 203. However, generally RDL 201 includes more than one metal layer 202 and more than one dielectric layer 203. Along those lines, metal layers 202 may be used to provide lengthwise routing (e.g., metal traces) and crosswise routing (e.g., metal vias), namely conductive routing 205, interconnected to one another. Conductive routing 205 may generally extend across an MCM 250 in part for interconnecting IC dies 126 and 127 to one another and in part for interconnection to through-mold vias. For purposes of clarity and not limitation, it shall be assumed that conductive routing 205 of RDL 201 includes upper contacts at upper surface 209 of RDL 201 and lower contacts at an opposite lower surface 218 of RDL 201.

In addition to conductive routing 205, conductors 204, such as conductive stacks 204 for example, may be formed in RDL 201. Conductive stacks 204 may be formed from one or more successive metal layers 202 stacked one on top of another. While conductive routing 205 may be located in a region of RDL 201 having conductive stacks 204, same is not illustratively depicted for purposes of more clearly showing conductive stacks 204. Moreover, conductive routing 205 need not be formed in regions between MCMs 250 to be singulated from one another.

Bottom ends of conductors 204 may be directly coupled to contacts 116 of bridge dies 103. Stacked sections of conductors 204 may extend away from contacts 116 and thus extend away from an associated upper surface 105 of a bridge die 103.

In another implementation, conductors 204 may be through-RDL conductive vias. Along those lines, an RDL 201 may be formed followed by forming through holes in such RDL 201 down to contacts 116, and such holes may be plated with metal or otherwise formed, as previously described. For purposes of clarity by way of example and not limitation, it shall be assumed that conductors 204 are conductive stacks 204.

Figures 1, 2, 3, 4, 5:
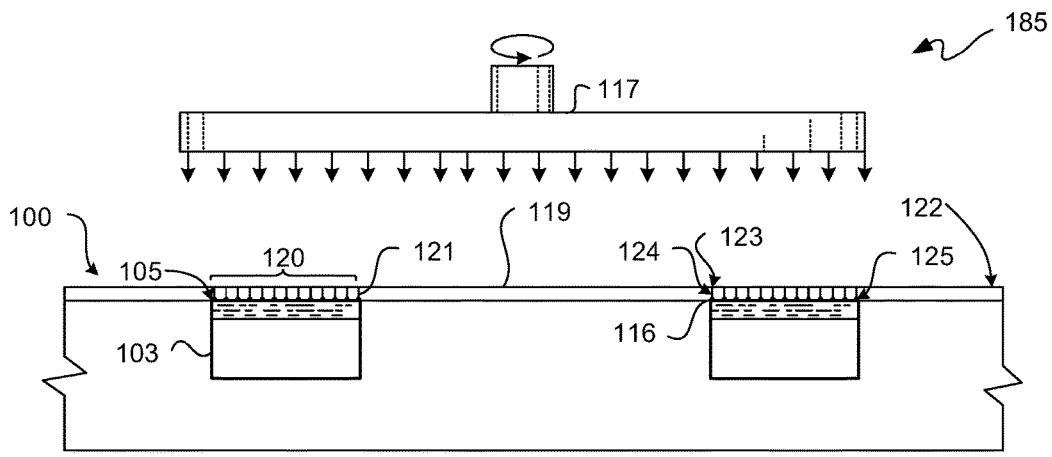

Along those lines, with additional reference to FIG. 5, where there is shown a schematic diagram depicting an exemplary conductive stack 204 in a portion of an RDL 201, conductive stacks 204 may be progressively formed in RDL 201. In this example of a portion of RDL 201, there are four dielectric layers 203 stacked one on top of another; however, in another example there may be fewer or more than four dielectric layers 203.

Each patterned dielectric layer 203 of a succession includes a metal layer 202 for forming a conductive via 206. Conductive vias 206 may be aligned to one another for forming a conductive stack 204, where each such conductive via 206 may provide a section of conductive stack 204.

In an example, such conductors 204 may in effect be at least substantially perpendicular to upper surface 105 to provide at least approximately a shortest conductive path for interconnection of upper dies to top ends of such conductors 204. Along those lines, bottom ends 208 of conductors 204 may be directly coupled to fine pitch contacts 116 for high-speed and/or broadband signaling applications.

Conductive vias 206 may not be exactly vertical, and thus top ends 207 and bottom ends 208 may be opposite one another, though not directly opposite one another for a shortest path implementation. For purposes of clarity by way of example and not limitation, it shall be assumed that conductors 204 are perpendicular to upper surface 105 such that top ends 207 of conductors 204 are directly opposite bottom ends 208 for a vertical shortest path orientation. Conductive vias 206 may have therein copper, aluminum, eutectic material (e.g., solder) or other conductive material to provide conductors 204.

An optional surfacing operation 117 may be performed on an upper surface 209 of RDL 201 to remove excess metal and to at least locally planarize top ends 207 of conductors 204. By locally planarize, it is generally meant that top ends 207 of conductors 204 of a same bridge die 103 are substantially planar with respect to one another. Again, this is not meant to preclude planarity of top ends 207 of conductors 204 for two or more bridge dies 103; rather, because upper IC dies 126 and 127 are indexed to top ends 207 of conductors 204 per bridge die 103, planarity between bridge dies 103 may not be needed. In other words, top ends 207 of conductors 204 collectively form an alignment feature 220 of a bridge die 103 for indexing two or more upper IC dies 126 and 127 to such alignment feature 220 of such same bridge die 103, where alignment feature 220 is similar to previously described alignment feature 120. Again, alignment feature 220 is in part for aligning IC dies 126 and 127 to bridge die 103 and in part for providing electrically conductive interconnects between bridge die 103 and IC dies 126 and 127.

At operation 282, sets of fine pitch contacts 130 and 131 respectively of IC dies 126 and 127 may be directly coupled to corresponding sets of top ends 207 of an alignment feature 220 of a bridge die 103. Fine pitch contacts 130 and 131 of IC dies 126 and 127 may be formed as part of corresponding BEOL stacks 102 of such IC dies 126 and 127, and may be the same as contacts 116, such as microbumps or micro pads for example. However, because an RDL 201 is formed, fine pitch contacts 130 and 131 may be used across lower die surfaces 129 instead of having contacts 140 and 141 of IC dies 126 and 127.

Again, bridge die 103 is in a face up orientation, namely a backside surface thereof is facing in an upward direction, and IC dies 126 and 127 coupled to such bridge die 103 are both in a face down orientation, namely respective backside surfaces thereof are facing in a downward direction. In this example, a gap 128 may be between facing sidewall surfaces of IC dies 126 and 127. Contacts 130 and 131 on corresponding lower die surfaces 129 of IC dies 126 and 127 overlap corresponding contacts 116 on an upper die surface 105 of bridge die 103 with respect to conductors 204. For a gap 128, top ends 207 of conductors 204 may be available for through-mold vias in an over mold layer for interconnection to bridge die 103, as previously described though not shown again for purposes of clarity and not limitation.

Optionally, operation 282 may include an optional etch 219, namely operation 282A. Along those lines, exposed dielectric material of RDL 201 between IC dies 126 and 127, for example, may be removed by etch 219. Etch 219 may be an anisotropic etch selective to such dielectric material for such removal. Etch 219 may be used to reveal a portion of upper wafer surface 115 associated with molding layer 114.

At operation 283, a molding layer 133, namely an over mold layer 133, may be molded or otherwise formed over and in one or more spaces between at least IC dies 126 and 127 and onto a remaining temporarily exposed upper surface portion of RDL 201. Such molding layer 133 may seal to sidewall surfaces of IC dies 126 and 127. Over mold layer 133 may be used to unitize reconstituted wafer 200 with bridge die 103, RDL 201, and at least IC dies 126 and 127 for having an in-process unitized MCM 250 in such reconstituted wafer 200.

For an optional etch 219 used, an alternative operation 283A may be used. Along those lines, an over mold layer may be formed, as previously described, except such over mold layer 133 may seal to a remaining temporarily exposed upper wafer surface 115 portion of molding layer 114 and sidewall surfaces of RDL 201. Thus, a mold layer-to-mold layer seal may be formed by having molding layers 114 and 133 abut along a portion of upper wafer surface 115.

In-process reconstituted wafer 200 may be further processed such as for example as described above with reference to operations at 189, 189A, and/or 190. Accordingly, such description is not repeated. Moreover, for purposes of clarity by way of example, it shall be assumed that reconstituted wafer 200 is thinned or surfaced down, and so operation 284 is substantially similar to operation 191.

Along those lines, at operation 284, a compliant layer 142 and through-mold vias 143 may be formed through compliant layer 142 and molding layer 114 as previously described and thus not repeated. However, an underfill layer may be omitted in this configuration with an RDL 201, and so bottom ends of through-mold vias 143 may be coupled for electrical conductivity to contacts, such as contact pads for example, of a metal layer 202 of RDL 201.

Previously described operations at 192 and 193 may be used on reconstituted wafer 200 to provide MCMs 250. Accordingly, repetitious description of operations at 192 and 193 is avoided for purposes of clarity and not limitation.

With the above-description borne in mind, it should be appreciated that by over molding after attachment of at least IC dies 126 and 127, shifting of die in an MCM, such as for fine pitch microbumps for example, is less likely. Furthermore, because IC dies 126 and 127 are aligned or indexed to a bridge die 103, coplanarity of IC dies 126 and 127 to one another need not be as difficult a requirement to manufacture of an MCM. In other words, if IC dies 126 and 127 are molded first to form a reconstituted wafer platform for subsequent coupling of a corresponding bridge die 103, then such IC dies 126 and 127 would generally be required to be at least substantially coplanar to one another for attachment of such bridge die 103. However, with a bridge die first molding flow, such requirement for coplanarity as between subsequently attached and molded IC dies 126 and 127 is at least substantially relaxed if not avoided in comparison to a non-bridge die first molding flow.

Figures 1, 2, 3, 4, 5, 6:
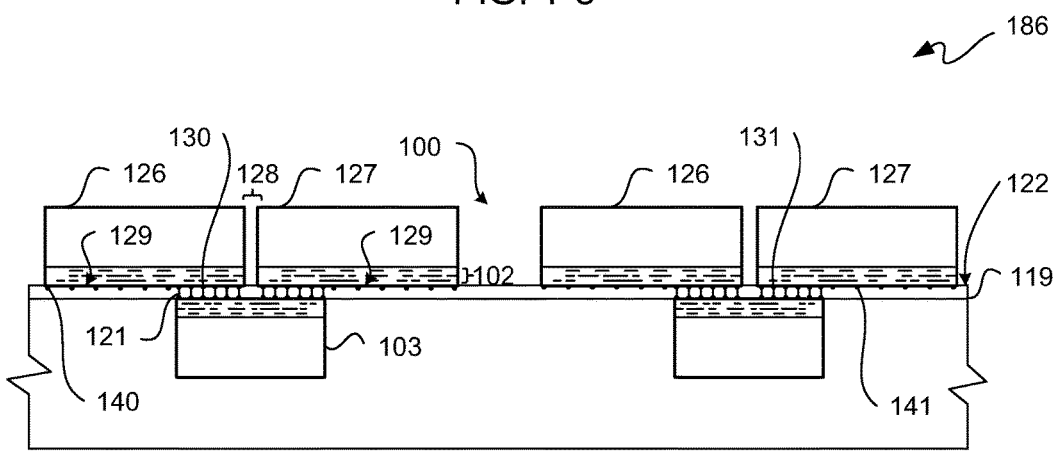
Figures 1, 2, 3, 4, 5, 6, 7:
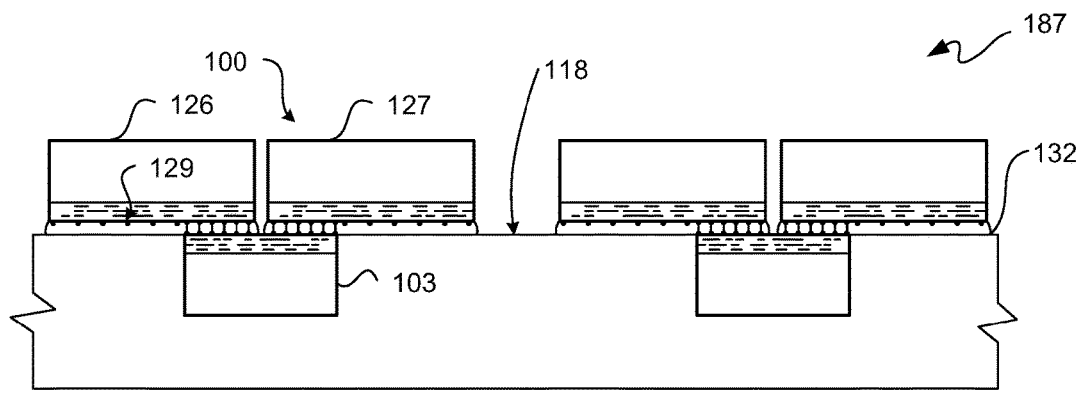
Figures 1, 2, 3, 4, 5, 6, 7, 8:
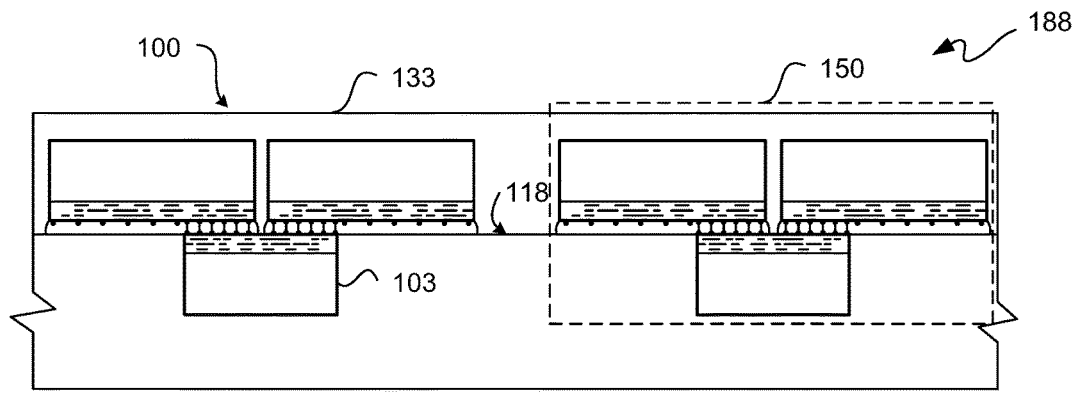
Figures 1, 2, 3, 4, 5, 6, 7, 8, 9:
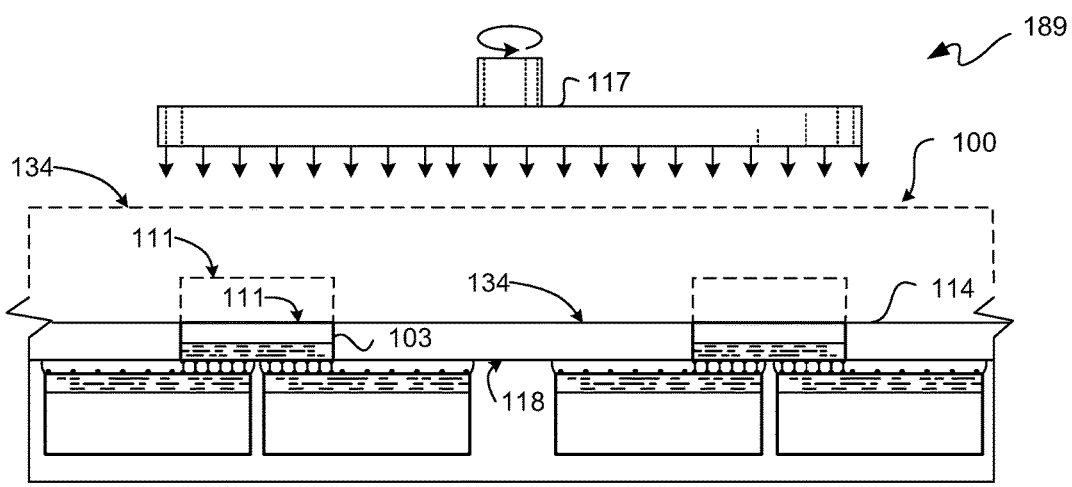
Figures 1, 2, 3, 4, 5, 6, 7, 8, 9, 10:
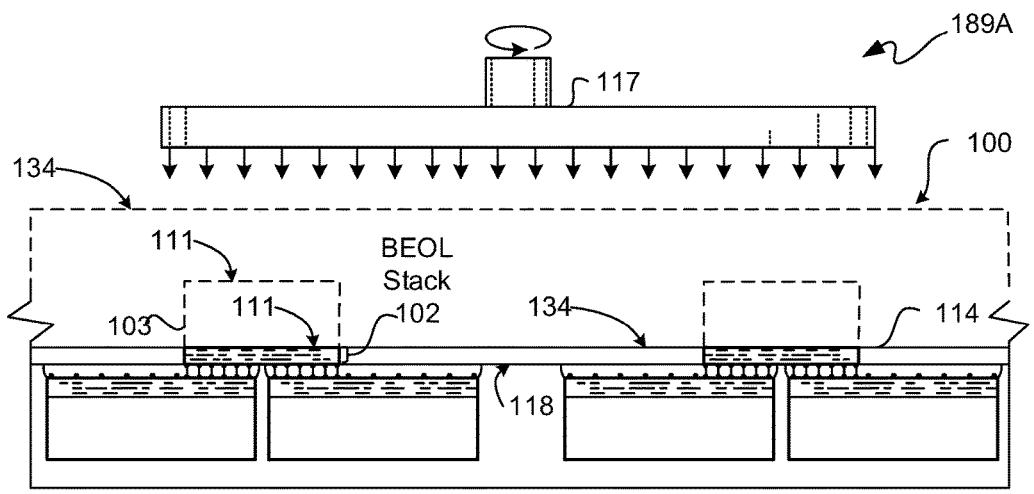
Figures 1, 2, 3, 4, 5, 6, 7, 8, 9, 10, 11:
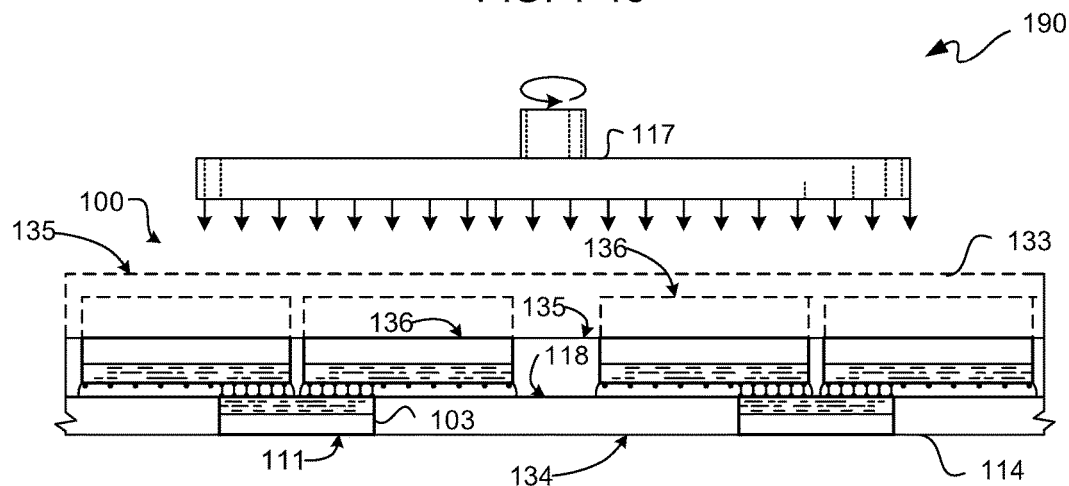
Figures 1, 2, 3, 4, 5, 6, 7, 8, 9, 10, 11, 12:
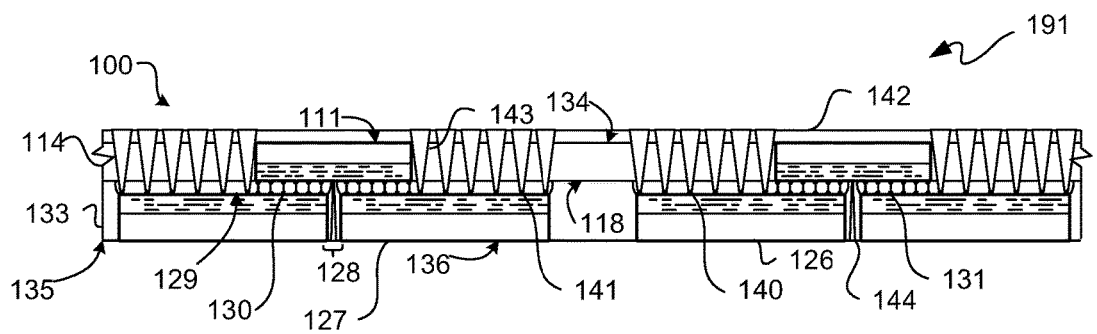
Figures 1, 2, 3, 4, 5, 6, 7, 8, 9, 10, 11, 12, 13:
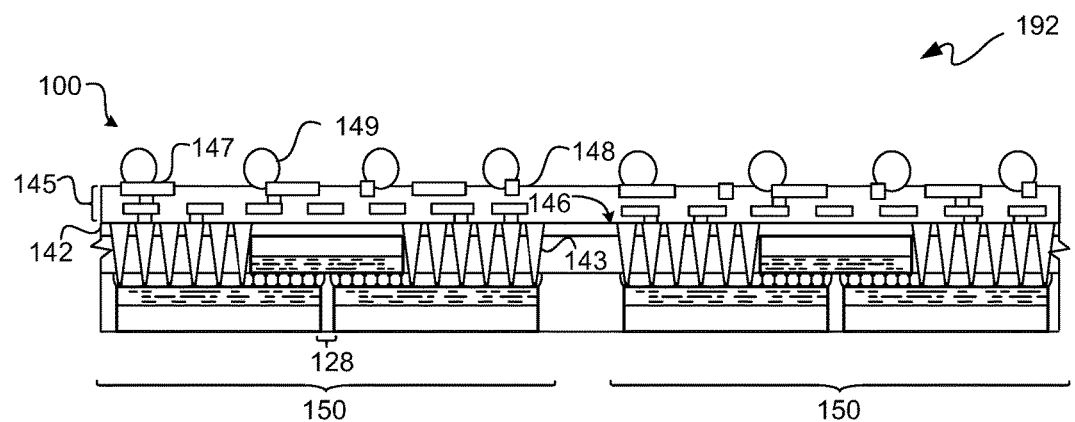
Figures 1, 2, 3, 4, 5, 6, 7, 8, 9, 10, 11, 12, 13, 14:
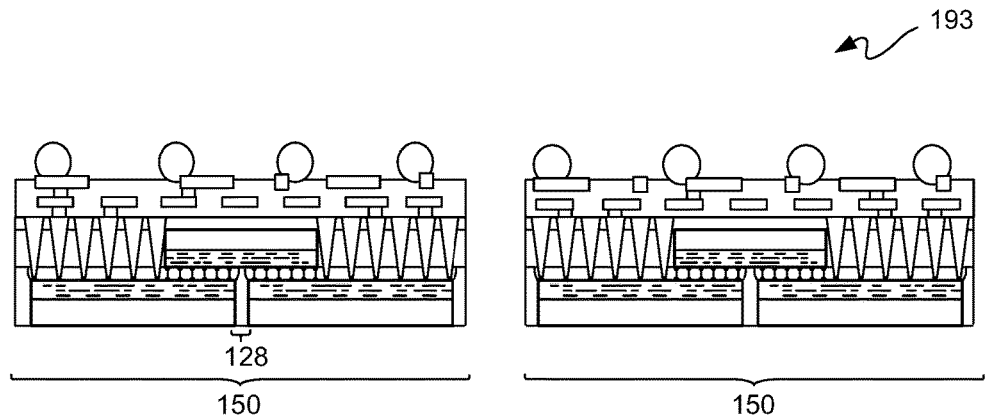
Figures 1, 2:
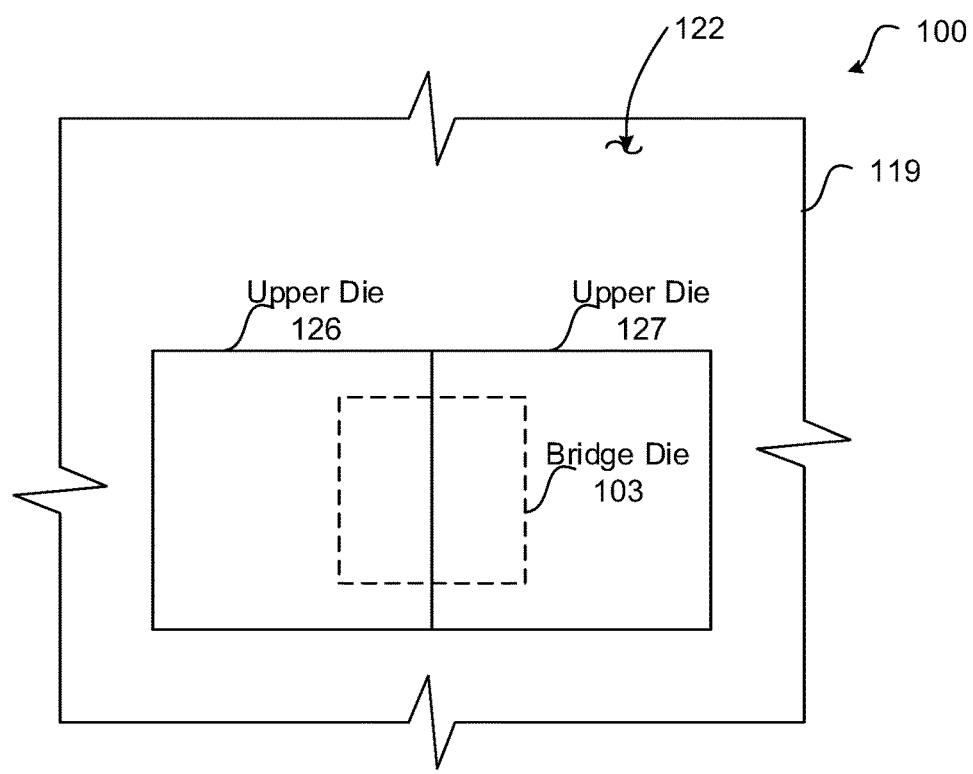
Figure 2:
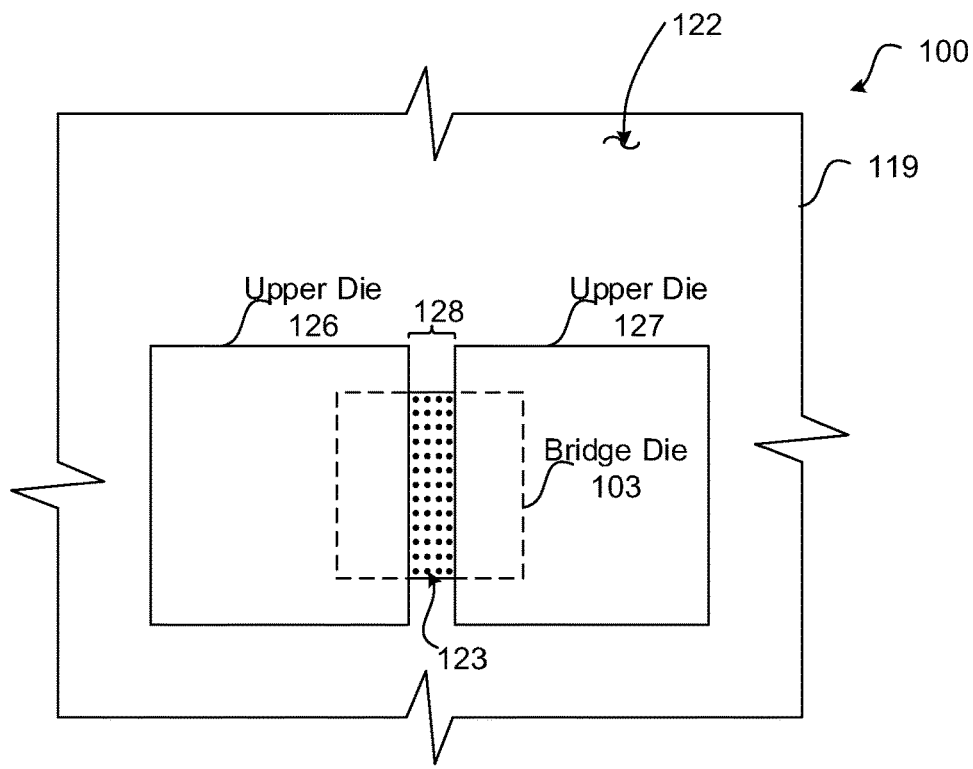
Figure 3:
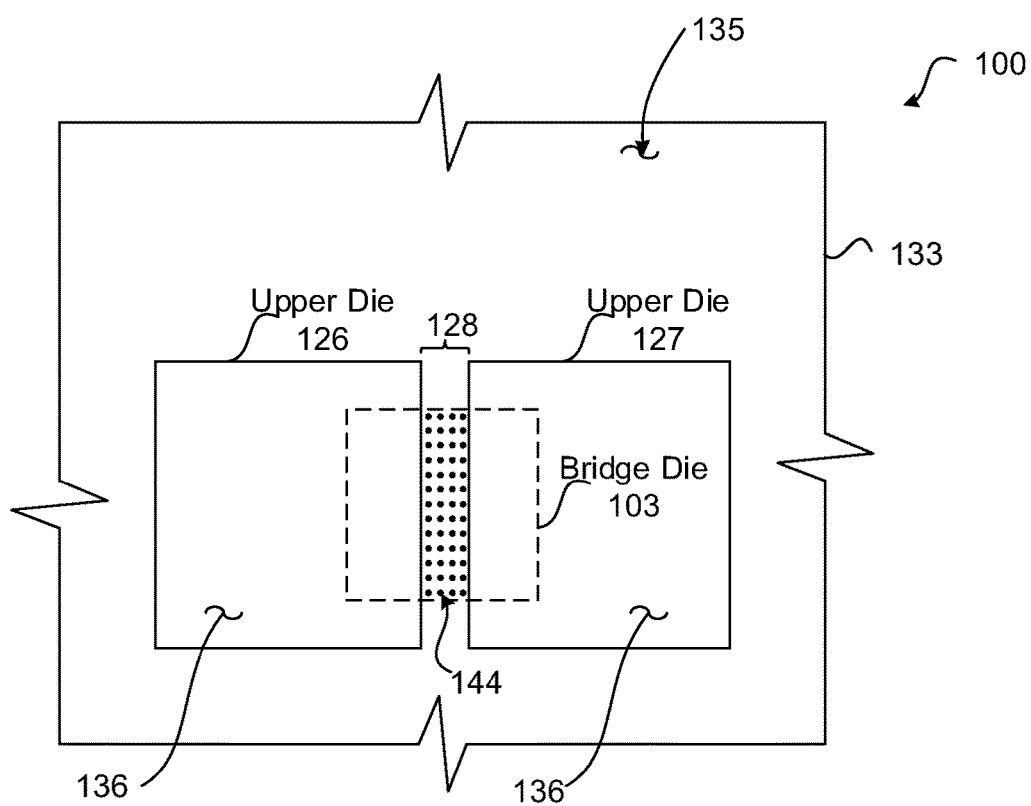
Figures 1, 4:
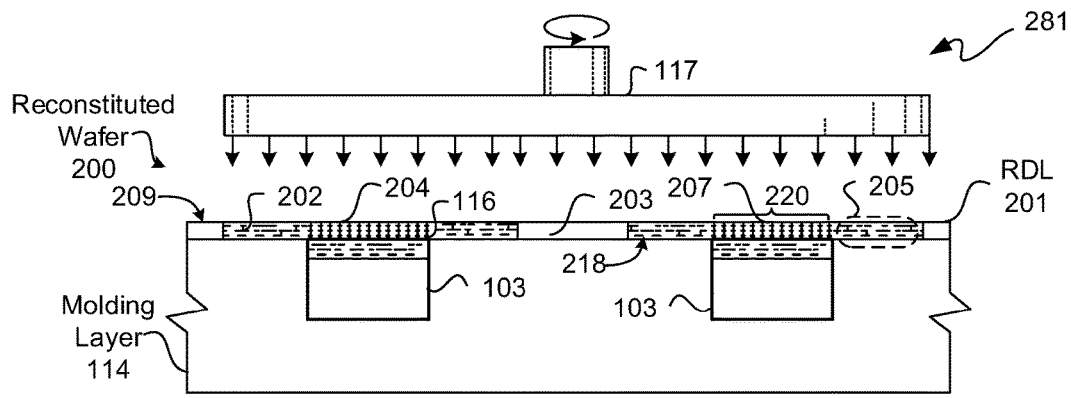
Figures 2, 4:
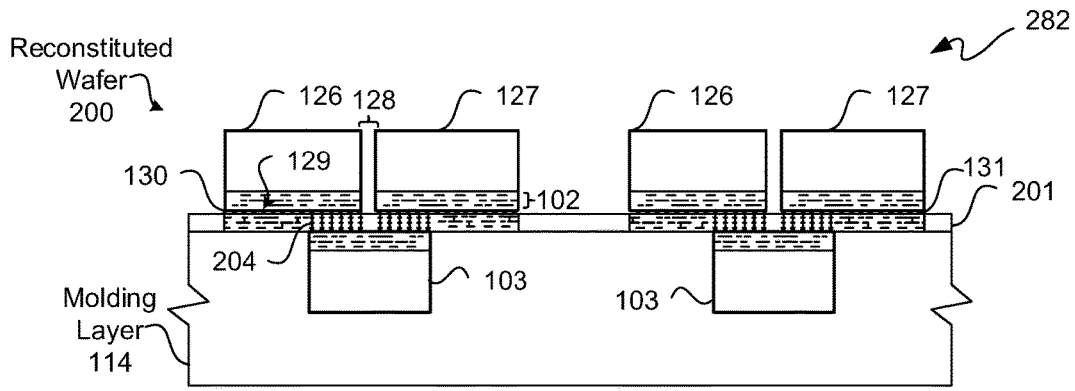
Figures 3, 4:
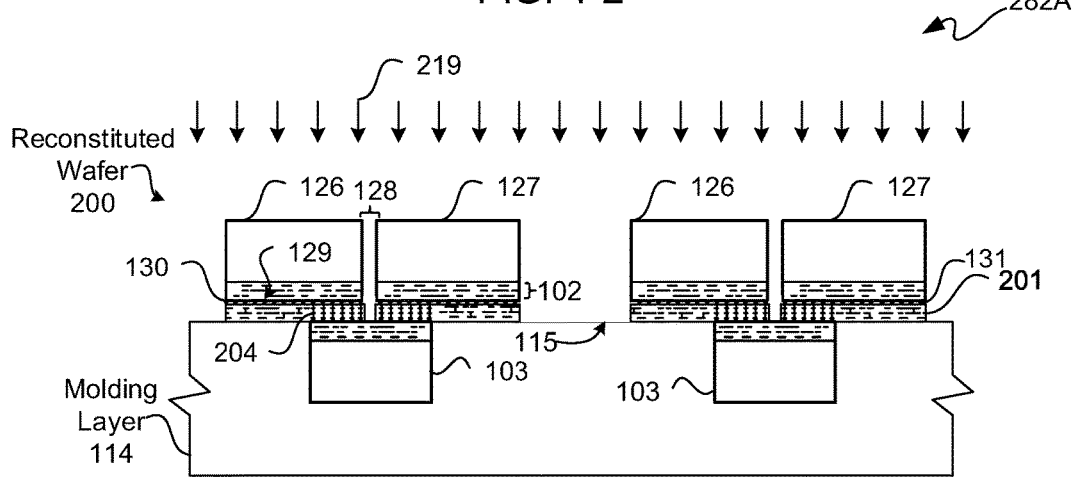
Figure 4:
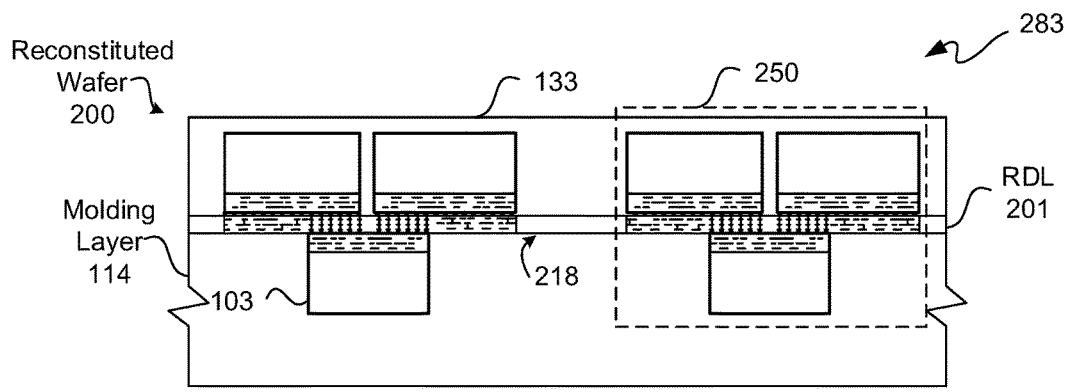
Figures 4, 5:
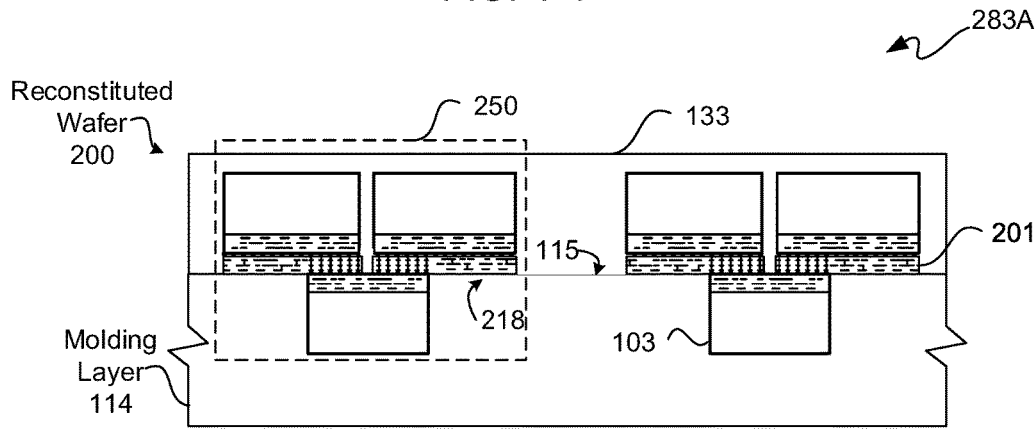
Figures 4, 5, 6:
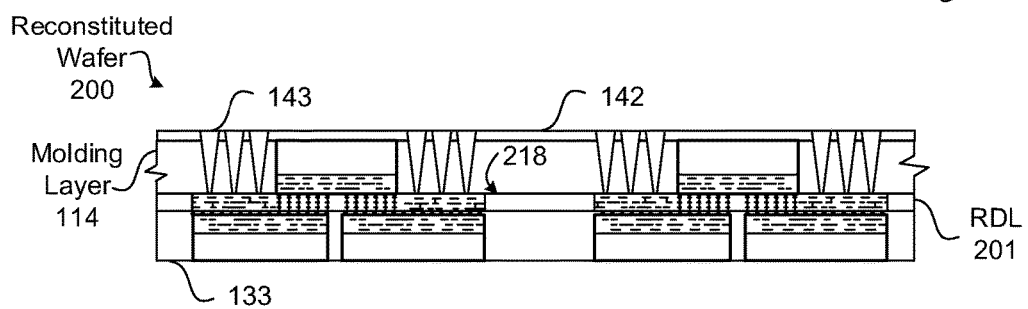
Figure 5:
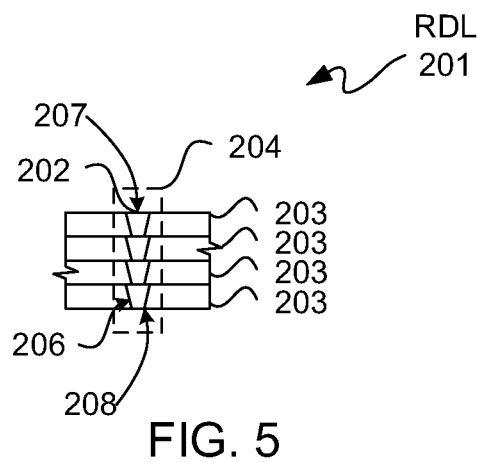
Figure 6:
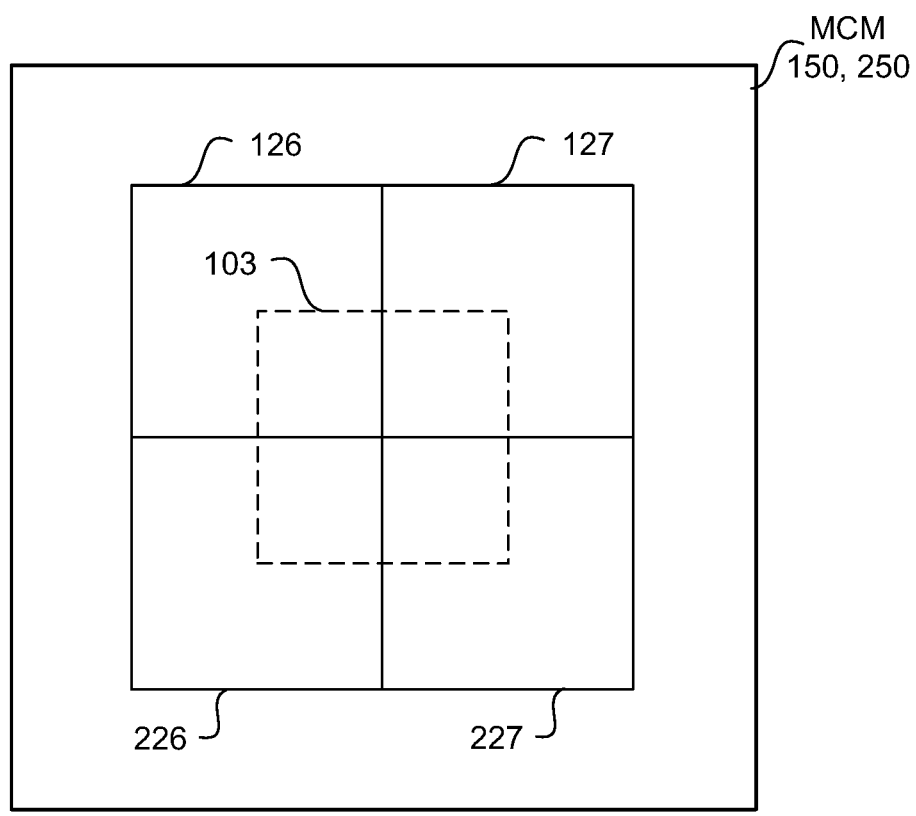

Relaxing coplanarity is even more beneficial for an MCM having more than two IC dies bridged by a bridge die 103. Along those lines, FIG. 6 is a block diagram of a top-down view depicting an exemplary MCM 150 or 250 having four IC dies 126, 127, 226, and 227 bridged by a same bridge die 103. Top ends of conductors attached to bridge die 103 may be used as alignment features for alignment of IC dies 126, 127, 226, and 227 to bridge die 103.

Additionally, in a mezzanine RDL 201 configuration between bridged IC dies and a bridge die 103, more interconnections may be made using such RDL 201, which may reduce the number of through-mold vias needed for power, ground, and input/output interconnects. This may reduce the impact of an MCM interface to a PCB owing to a larger pitch of through-mold vias ("TMVs") limiting the number of such TMVs.

As previously described, a reconstituted wafer 100 and/or 200 may be thinned or surfaced down. This thinning may be used to provide a "low profile" MCM 150 and/or 250. Such a low profile MCM may be less than approximately 200 microns. Furthermore, bridge die 103 may be formed without through-substrate vias ("TSVs"), as TMVs may be used for interconnection without such TSVs. This avoidance of TSVs may reduce costs and improve reliability.

Additionally, having one or more RDLs, either or both of which may be formed for example with a laminate process for providing routing, may lower cost over a conventional 2.5D MCM that uses an interposer die for such routing. In the above-described MCMs 150 and 250, no interposer die is used.

While the foregoing describes exemplary embodiment(s) in accordance with one or more aspects of the disclosure, other and further embodiment(s) in accordance with the one or more aspects of the disclosure may be devised without departing from the scope thereof, which is determined by the claim(s) that follow and equivalents thereof. Each claim of this document constitutes a separate embodiment, and embodiments that combine different claims and/or different embodiments are within the scope of the disclosure and will be apparent to those of ordinary skill in the art after reviewing this disclosure. Claim(s) listing steps do not imply any order of the steps. Trademarks are the property of their respective owners.

What is claimed is:

1. An apparatus for a microelectronic device, comprising:
   a first integrated circuit die having first contacts on a die surface thereof in a molding layer of a reconstituted wafer having a wafer surface including a layer surface of the molding layer and the die surface of the first integrated circuit die;
   a redistribution layer on the wafer surface including electrically conductive layers and dielectric layers to provide conductive routing and shortest path vertically oriented conductors, the conductors extending away from the die surface of the first integrated circuit die and respectively coupled to the first contacts at bottom ends of the conductors;
   at least second and third integrated circuit dies respectively having second contacts on die surfaces thereof interconnected to the first integrated circuit die through the conductors of the redistribution layer;
   a first portion of the second contacts of each of the at least second and third integrated circuit dies interconnected to top ends of the conductors opposite the bottom ends thereof, the top ends of the conductors in part for alignment of the at least second and third integrated circuit dies to the first integrated circuit die located below the redistribution layer; and
   a second portion of the second contacts interconnected to one another through the conductive routing.

2. The apparatus according to claim 1, wherein the molding layer is a first molding layer, the apparatus further comprising a second molding layer located on the at least second and third integrated circuit dies and in a space therebetween and further on the redistribution layer for unitization of the reconstituted wafer with the first integrated circuit die, the redistribution layer, and the at least second and third integrated circuit dies.

3. The apparatus according to claim 2, wherein:
   the layer surface of the first molding layer is a first layer surface;
   the die surface of the first integrated circuit die is a first die surface thereof;
   the dies surfaces of the at least second and third integrated circuit dies are respective first die surfaces thereof;
   a second layer surface of the first molding layer opposite the first layer surface thereof is surfaced down to at least a second die surface of the first integrated circuit die opposite the first die surface thereof; and
   a layer surface of the second molding layer is surfaced down to second die surfaces respectively of the at least second and third integrated circuit dies opposite the first dies surfaces thereof.

4. The apparatus according to claim 1, wherein the molding layer is a first molding layer, the apparatus further comprising a second molding layer located on the at least second and third integrated circuit dies and in a space therebetween and further on a portion of the layer surface of the first molding layer for unitization of the reconstituted wafer with the first integrated circuit die, the redistribution layer, and the at least second and third integrated circuit dies.

5. The apparatus according to claim 4, wherein:
   the layer surface of the first molding layer is a first layer surface;
   the die surface of the first integrated circuit die is a first die surface thereof;
   the dies surfaces of the at least second and third integrated circuit dies are respective first die surfaces thereof;
   a second layer surface of the first molding layer opposite the first layer surface thereof is surfaced down to at least a second die surface of the first integrated circuit die opposite the first die surface thereof; and
   a layer surface of the second molding layer is surfaced down to second die surfaces respectively of the at least second and third integrated circuit dies opposite the first die surfaces thereof.

6. The apparatus according to claim 1, wherein:
   the layer surface of the first molding layer is a first layer surface; and
   the redistribution layer is a first redistribution layer;
   the apparatus further comprising:
   a compliant layer on a second layer surface of the molding layer opposite the first layer surface;
   through-mold vias extending through the compliant layer and the first molding layer to the first redistribution layer; and
   an interconnect structure configured to provide an electrical interface from upper ends of the through-mold vias to lower ends thereof interconnected to the first redistribution layer, the interconnect structure being a package substrate or a second redistribution layer.

7. The apparatus according to claim 1, wherein the layer surface of the molding layer is a first layer surface, the apparatus further comprising a second layer surface of the first molding layer opposite the first layer surface thereof and opposite the die surface of the first integrated circuit die surfaced down to a back-end of line stack of the first integrated circuit die.

8. An apparatus for a microelectronic device, comprising:
   a first integrated circuit die having first contacts on a first die surface thereof in a first molding layer of a reconstituted wafer having a wafer surface including a first layer surface of the first molding layer and the first die surface of the first integrated circuit die;
   a redistribution layer on the wafer surface including electrically conductive layers and dielectric layers to provide conductive routing and conductors, the conductors extending away from the first die surface of the first integrated circuit die and respectively coupled to the first contacts at bottom ends of the conductors;

at least second and third integrated circuit dies respectively having second contacts on first die surfaces thereof interconnected to the first integrated circuit die through the conductors of the redistribution layer;

a first portion of the second contacts of each of the at least second and third integrated circuit dies interconnected to top ends of the conductors opposite the bottom ends thereof, the top ends of the conductors in part for alignment of the at least second and third integrated circuit dies to the first integrated circuit die located below the redistribution layer;

a second portion of the second contacts interconnected to one another through the conductive routing;

a second molding layer located on the at least second and third integrated circuit dies and in a space therebetween and further on the redistribution layer for unitization of the reconstituted wafer with the first integrated circuit die, the redistribution layer, and the at least second and third integrated circuit dies;

a second layer surface of the first molding layer opposite the first layer surface thereof is surfaced down to at least a second die surface of the first integrated circuit die opposite the first die surface thereof; and a layer surface of the second molding layer is surfaced down to second die surfaces respectively of the at least second and third integrated circuit dies opposite the first dies surfaces thereof.

9. An apparatus for a microelectronic device, comprising:

a first integrated circuit die having first contacts on a first die surface thereof in a first molding layer of a reconstituted wafer having a wafer surface including a first layer surface of the first molding layer and the first die surface of the first integrated circuit die;

a redistribution layer on the wafer surface including electrically conductive layers and dielectric layers to provide conductive routing and conductors, the conductors extending away from the first die surface of the first integrated circuit die and respectively coupled to the first contacts at bottom ends of the conductors;

at least second and third integrated circuit dies respectively having second contacts on first die surfaces thereof interconnected to the first integrated circuit die through the conductors of the redistribution layer;

a first portion of the second contacts of each of the at least second and third integrated circuit dies interconnected to top ends of the conductors opposite the bottom ends thereof, the top ends of the conductors in part for alignment of the at least second and third integrated circuit dies to the first integrated circuit die located below the redistribution layer;

a second portion of the second contacts interconnected to one another through the conductive routing;

a second molding layer located on the at least second and third integrated circuit dies and in a space therebetween and further on a portion of the first layer surface of the first molding layer for unitization of the reconstituted wafer with the first integrated circuit die, the redistribution layer, and the at least second and third integrated circuit dies;

a second layer surface of the first molding layer opposite the first layer surface thereof is surfaced down to at least a second die surface of the first integrated circuit die opposite the first die surface thereof; and a layer surface of the second molding layer is surfaced down to second die surfaces respectively of the at least second and third integrated circuit dies opposite the first dies surfaces thereof.

\* \* \* \* \*